United States Patent
Nguyen

(10) Patent No.: US 7,053,687 B1
(45) Date of Patent: May 30, 2006

(54) BINARY HYSTERESIS COMPARATOR CIRCUITS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 184 days.

(21) Appl. No.: 10/772,820

(22) Filed: Feb. 5, 2004

(51) Int. Cl.
*H03H 11/16* (2006.01)

(52) U.S. Cl. .................. 327/231; 327/244; 327/248

(58) Field of Classification Search ........... 327/205, 327/231, 236, 241, 243–244, 246, 248, 407
See application file for complete search history.

(56) References Cited

U.S. PATENT DOCUMENTS

| | | | |
|---|---|---|---|
| RE34,808 E | | 12/1994 | Hsieh |
| 5,912,926 A | * | 6/1999 | Koenck et al. ............ 375/295 |
| 6,208,671 B1 | * | 3/2001 | Paulos et al. ............ 370/545 |
| 6,366,136 B1 | | 4/2002 | Page |
| 6,642,764 B1 | * | 11/2003 | Deas et al. .................. 327/205 |
| 6,894,542 B1 | | 5/2005 | Prexl et al. |

OTHER PUBLICATIONS

U.S. Appl. No. 10/696,227, filed Oct. 28, 2003, Nguyen.

* cited by examiner

*Primary Examiner*—My-Trang Nu Ton
(74) *Attorney, Agent, or Firm*—Lois D. Cartier

(57) ABSTRACT

Binary hysteresis comparator circuits, methods, and applications. A binary constant defines a window within which a binary input can change its value without triggering the comparator circuit output signal. An exemplary binary hysteresis comparator circuit includes a comparator circuit, an adder circuit, and a multiplexer circuit. The comparator circuit compares two multi-bit input values. A first comparator input is provided by the multiplexer circuit, which selects either a first value or a second value, depending on the comparator output signal. The first and second values differ by the binary constant, which is added to or subtracted from a multi-bit circuit input value by the adder circuit. An increase (or decrease) of less than the binary constant is ignored. Some embodiments include an optional overflow prevention circuit that prevents the selected value from exceeding predetermined parameters.

5 Claims, 7 Drawing Sheets

BINARY HYSTERESIS COMPARATOR CIRCUITS AND METHODS

FIELD OF THE INVENTION

The invention relates to digital circuits that provide hysteresis. More particularly, the invention relates to comparator circuits providing binary hysteresis.

BACKGROUND OF THE INVENTION

The term "hysteresis" generally refers to the process of compensating for variations (e.g., "noise") in an input signal by adjusting the point at which a system reacts to the input signal. For example, in electrical circuits a rising signal can be detected at a first and higher voltage level (the "rising edge trip point"), while a falling signal can be detected at a second and lower voltage level (the "falling edge trip point"). FIGS. 1–3 are waveform diagrams that can be used to describe this type of hysteresis, which is referred to herein as "level hysteresis".

FIG. 1 illustrates the process of an ideally clean input signal IN rising and falling, and its effect on an output signal OUT of inverter 101. Input signal IN rises linearly from a low value (e.g., a ground value) to a high value (e.g., power high VDD). Half-way through the rising edge, at time Tr, the voltage level on signal IN reaches the trip point tp and inverter 101 is triggered. Thus, the output signal OUT from inverter 101 begins to fall. Signal OUT also falls linearly in this ideal circuit, from the high value to the low value. After a time, input signal IN changes state again, falling linearly from the high value to the low value. Half-way through the falling edge, at time Tf, the voltage level on signal IN reaches the trip point tp and inverter 101 is triggered. Thus, the output signal OUT from inverter 101 begins to rise. Signal OUT also rises linearly in this ideal circuit, from the low value to the high value. Thus, signal OUT is a noise-free output signal ideally suited to drive other circuitry.

FIG. 2 illustrates what happens to the idealized signals of FIG. 1 in a noisy signal environment. Both the rising and falling edges of signal IN are subject to sudden alterations that can momentarily cause the signal to rise above, then fall below, the trip point tp. Each time input signal IN rises above the trip point (e.g., at times T1, T3, and T5), output signal OUT changes from the high value to the low value. Each time input signal IN falls below the trip point (e.g., at times T2, T4, and T6), output signal OUT changes from the low value to the high value. The result is a noisy output signal OUT, as shown in FIG. 2.

FIG. 3 illustrates the resulting waveforms when inverter 101 is replaced by a Schmitt trigger 301. Schmitt triggers are well known. For example, one Schmitt trigger is described by Hsieh in U.S. Reissue Pat. No. Re. 34,808, "TTL/CMOS Compatible Input Buffer with Schmitt Trigger", which is incorporated herein by reference. A Schmitt trigger provides level hysteresis in the manner previously described, by providing different trip points for the rising and falling edges of the input signal. The rising edge trip point tpr is higher than the falling edge trip point tpf. Thus, the brief and limited negative movements in voltage level during the rising edge of input signal IN do not cause the output signal OUT to rise to the high value. Similarly, the brief and limited positive movements in voltage level during the falling edge of input signal IN do not cause the output signal OUT to fall to the low value. Hence, the circuit of FIG. 3 is noise-immune, provided the extent of the noise does not exceed the protection provided by the difference in trip-points.

Schmitt triggers can be very useful, when they are available. However, they do have their drawbacks in some applications. For example, Schmitt triggers are analog circuits that cannot readily be implemented in the digital programmable logic generally available in programmable logic devices (PLDs). PLDs typically provide arrays of digital logic elements that can be programmed to assume various configurations performing desired digital functions. However, analog functions typically cannot be implemented in a PLD unless they are deliberately included in the fabric of the PLD by the PLD designer and manufacturer.

Therefore, it is desirable to provide digital circuits and methods of providing hysteresis, e.g., hysteresis circuits and methods that can be implemented in digital PLDs.

SUMMARY OF THE INVENTION

The invention provides binary hysteresis comparator circuits and methods, with exemplary applications of these circuits and methods. Within the binary hysteresis comparator circuits of the invention, a binary constant defines a window within which a binary input can change its value without triggering the comparator circuit output signal.

According to one embodiment, a binary hysteresis circuit includes a comparator circuit, an adder circuit, and a multiplexer circuit. The comparator circuit compares two multi-bit comparator input values. A first comparator input value is provided by the multiplexer circuit, which selects either a first value or a second value, depending on the output signal from the comparator circuit. The first and second values differ by a binary constant, e.g., a constant value added to or subtracted from a first multi-bit circuit input value by the adder circuit. An increase (or decrease, in some embodiments) in the second comparator input value of less than the binary constant is ignored.

The adder circuit can be, for example, an adder, a subtractor (e.g., adding a negative binary number), an adder/subtractor (e.g., programmably adding or subtracting a value), an incrementor (adding one), or a decrementor (subtracting one). Some embodiments of the invention include an additional adder circuit. The two adder circuits add or subtract two different constant values from a multi-bit input signal, and provide the two resulting values to the data input terminals of the multiplexer circuit.

The second comparator input value can be a fixed value such as a reference value, a value provided to the circuit via input terminals, a value selected from a table of supported values, or a value provided by another source.

In some embodiments, an optional overflow prevention circuit prevents the changing value from overrunning predetermined parameters, e.g., prevents the selection of a negative value in applications where the selected value must be a positive number.

The invention also encompasses related methods of performing comparisons between two binary input values while providing binary hysteresis.

The invention further encompasses applications utilizing the circuits and methods of the invention. These applications include, but are not limited to, phase shifter circuits.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
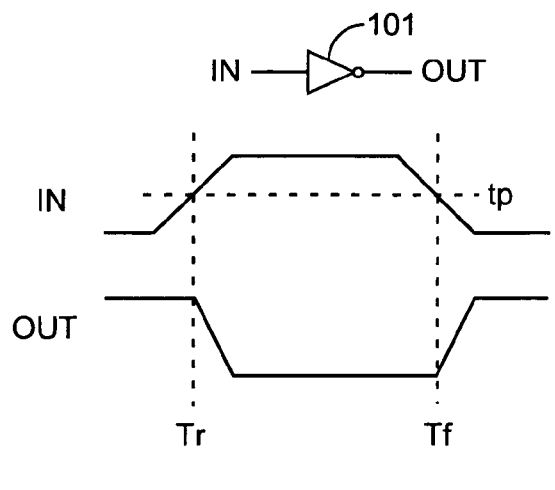
FIG. 1 is a waveform diagram of idealized input and output signals for an inverter.
Figure 2:
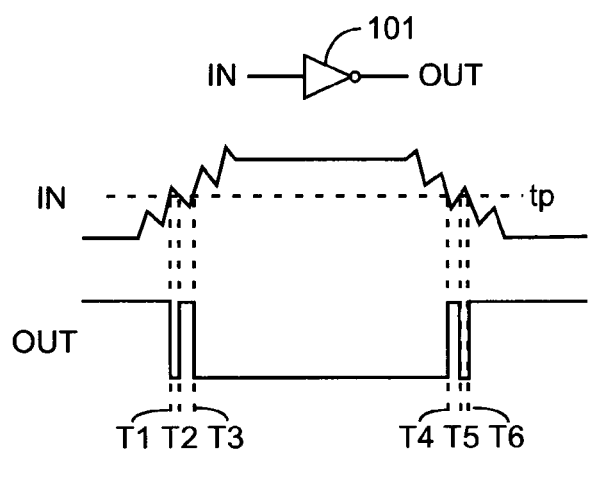
FIG. 2 is a waveform diagram illustrating input and output signals for an inverter in a noisy signal environment.
Figure 3:
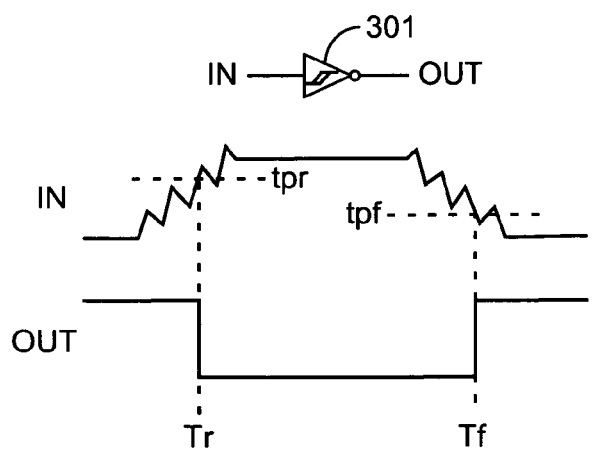
FIG. 3 is a waveform diagram illustrating input and output signals for a Schmitt trigger in a noisy signal environment.
Figure 4:
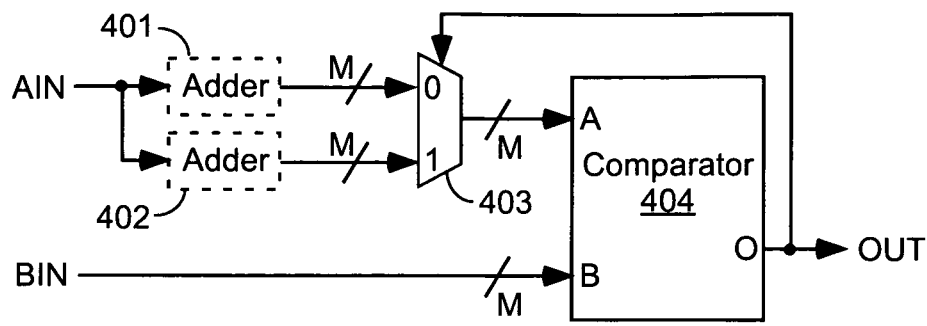
FIG. 4 illustrates a first binary hysteresis comparator circuit.

FIG. 4 illustrates a first comparator circuit having binary hysteresis, according to one embodiment of the present invention. "Binary hysteresis" differs from "level hysteresis" in that instead of providing two different voltage trip points for the rising and falling edges of an input signal, two different values are used when comparing increasing and decreasing binary values.

The circuit of FIG. 4 includes two adder circuits 401–402, a multiplexer circuit 403, and a comparator circuit 404. A multi-bit input signal AIN is provided to each adder circuit, each of which adds or subtracts a predetermined constant value from the input signal AIN. (In the present specification, the same reference characters are used to refer to terminals, signal lines, and their corresponding signals.) The two resulting values are provided to multiplexer circuit 403, which selects one of the resulting values based on the comparator output signal OUT. Comparator circuit 404 compares the multi-bit multiplexer output signal A with a second multi-bit input signal B (BIN), and provides an output signal O (which is also circuit output signal OUT) based on the result of the comparison.

Note that adder circuits 401–402 are drawn using dotted lines, indicating that either of the two adder circuits can be omitted, if desired. The two input signals to multiplexer circuit 403 must differ by a predetermined value. However, this difference value can be obtained by adding a constant to either or both multiplexer inputs, by subtracting a constant from either or both multiplexer inputs, or by adding a constant to one multiplexer input and subtracting the same or another constant from the other multiplexer input. Thus, each adder circuit 401–402 can be an adder or a subtractor, and up to one of the two adder circuits can be omitted.

Comparator circuit 404 can be a greater-than comparator, a less-than comparator, a greater-than-or-equal-to comparator, or a less-than-or-equal-to comparator.

Figure 4A:
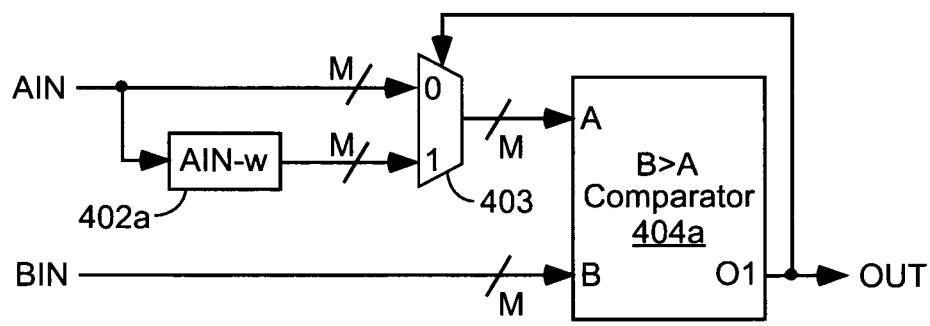
FIG. 4a illustrates one version of the binary hysteresis comparator circuit of FIG. 4.

FIG. 4A illustrates one version of the binary hysteresis comparator circuit of FIG. 4. The circuit of FIG. 4A is a greater-than comparator having a binary hysteresis of w, where w is a binary constant. In this version, adder circuit 401 is omitted, and adder circuit 402 is implemented as a subtractor 402a, which subtracts a constant value w from the binary value present at input terminal AIN. Comparator circuit 404 is implemented as a greater-than comparator 404a, i.e., output signal O1 is high whenever the binary value present at input terminal B is greater than the binary value present at input terminal A.

In the circuit of FIG. 4A, starting (for illustrative purposes) with equal values of AIN and BIN, an increase in the value of BIN by a value of binary one is detected, causing the circuit to report that BIN is greater than AIN (e.g., signal OUT goes high). However, the change in the value of signal OUT causes multiplexer circuit 403 to select a value of AIN from which the constant w has been subtracted (AIN–w). Thus, a following decrease in the value of BIN by a value of binary one is ignored, although BIN is no longer greater than AIN. Not until BIN is less than AIN by a value of w does the binary hysteresis comparator circuit of FIG. 4A detect the change and report that BIN is no longer greater than AIN (e.g., signal OUT goes low). Thus, in this example binary hysteresis is provided to multi-bit signal BIN. Because the circuit of FIG. 4A operates based on a difference between the values of AIN and BIN, the circuit also provides hysteresis to signal AIN.

The circuit of FIG. 4A operates as described in the following example. For exemplary purposes, the constant w subtracted by subtractor 402a has a 4-bit value of binary two, or 0010. However, any constant that can be accommodated by the number of bits in signals AIN and BIN can be used, and this value is purely exemplary.

Initially, for the purposes of this example, input signals AIN and BIN both have the same value. For simplicity, assume that both AIN and BIN are 4-bit values and each has the value of 0111. The output of comparator circuit 404a is low. Thus, multiplexer circuit 403 selects the AIN input signal from the "0" data input terminal and provides the multi-bit AIN signal to terminal A of comparator 404a. Because signals AIN and BIN are both 0111, B (BIN) is not greater than A (AIN), and signal O1 from comparator 404a remains low. Output signal OUT is low, and the circuit is in a steady state.

Now assume that BIN increases in value by binary one (BIN=1000). Note that BIN is now greater than AIN (AIN=0111). Subtractor 402a subtracts a value w (0010 in the present example) from AIN. Thus, subtractor 402a provides the binary value 0101 (AIN–w) to the "1" data terminal of multiplexer circuit 403. Multiplexer circuit 403 now has a value of 0111 (AIN) at the "0" data terminal and a value of 0101 (AIN–w) at the "1" data terminal. Because signal OUT is still low, multiplexer circuit 403 passes the value 0111 (AIN) from the "0" data terminal to input terminal A of comparator circuit 404a. The value A (0111) is now less than the value B (BIN=1000), so the output O1 of comparator circuit 404a goes high, along with circuit output signal OUT.

When signal OUT goes high, multiplexer circuit 403 selects the value 0101 (AIN–w) from the "1" data terminal, and provides this value to the A terminal of comparator circuit 404a. The value at terminal A (0101) is still less than the value at terminal B (1000), so the comparator output signal O1 remains high, along with circuit output signal OUT.

Thus, the circuit of FIG. 4A detects an increase in the value of BIN compared to AIN by a value of binary one.

Now assume that BIN decreases in value by one from the increased value of 1000 (BIN=0111). Note that BIN is now equal to AIN (BIN=AIN=0111). As before, subtractor 402a provides the binary value 0101 (AIN−w) to the "1" data terminal of multiplexer circuit 403. Therefore, multiplexer circuit 403 has a value of 0111 (AIN) at the "0" data terminal and a value of 0101 (AIN−w) at the "1" data terminal. Because signal OUT is still high, multiplexer circuit 403 passes the value 0101 from the "1" data terminal to input terminal A of comparator circuit 404a. The value A (0101) is less than the value B (BIN=0111), so the output of comparator circuit 404a remains high, along with circuit output signal OUT.

Note that the circuit of FIG. 4A continues to report that the value at terminal BIN is greater than the value at terminal AIN (i.e., signal OUT remains high), although both values are equal. Thus, binary "noise" of binary one (w−1, because w=2 in this example) on terminal BIN is ignored.

Now assume that BIN decreases again in value by one (BIN=0110). Note that BIN is now less than AIN by one (AIN=0111). As before, subtractor 402a provides the binary value 0101 to the "1" data terminal of multiplexer circuit 403. Therefore, multiplexer circuit 403 has a value of 0111 (AIN) at the "0" data terminal and a value of 0101 (AIN−w) at the "1" data terminal. Because signal OUT is still high, multiplexer circuit 403 passes the value 0101 from the "1" data terminal to input terminal A of comparator circuit 404a. The value A (0101) is still less than the value B (BIN=0110), so the output of comparator circuit 404a remains high.

Note that the circuit of FIG. 4A continues to report that the value at terminal BIN is greater than the value at terminal AIN (signal OUT remains high), although BIN is actually less than AIN by one (w−1). Thus, binary "noise" of binary two (w) on terminal BIN is also ignored.

To complete the present example, assume that BIN decreases again in value by one (BIN=0101). Note that BIN is now less than AIN by w=two (AIN=0111). As before, subtractor 402a provides the binary value 0101 to the "1" data terminal of multiplexer circuit 403. Multiplexer circuit 403 has a value of 0111 (AIN) at the "0" data terminal and a value of 0101 (AIN−w) at the "1" data terminal. Because signal OUT is still high, multiplexer circuit 403 passes the value 0101 from the "1" data terminal to input terminal A of comparator circuit 404a. The value A (0101) is now equal to the value B (BIN=0101), so the output of comparator circuit 404a finally goes low.

When signal OUT goes low, multiplexer circuit 403 selects the value 0111 (AIN) from the "1" data terminal, and provides this value to the A terminal of comparator circuit 404a. The new value at terminal A (0111) is greater than the value at terminal B (0101), so the comparator output signal O1 remains low, along with circuit output signal OUT.

Thus, the circuit of FIG. 4A provides hysteresis for the value at terminal BIN of the circuit, up to a maximum value of w. Again, note that while the example describes the provision of hysteresis to signal BIN, the circuit of FIG. 4A operates based on a difference between the values of signals AIN and BIN. Thus, hysteresis is also provided to signal AIN.

Note that the circuit of FIG. 4A can also be implemented using a greater-than-or-equal-to comparator circuit, in which output signal O1 is high whenever the binary value present at input terminal B is greater than or equal to, i.e., no less than, the binary value present at input terminal A. The resulting circuit is a greater-than-or-equal-to comparator circuit providing binary hysteresis.

Figure 4B:
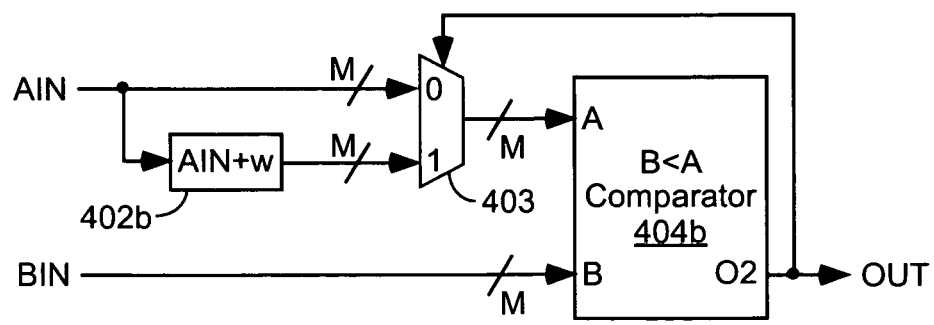
FIG. 4b illustrates another version of the binary hysteresis comparator circuit of FIG. 4.

FIG. 4B provides a second version of the binary hysteresis comparator circuit of FIG. 4. The circuit of FIG. 4B is a less-than comparator having a binary hysteresis of w, where w is a binary constant. In this version, adder circuit 401 is omitted, and adder circuit 402 is implemented as an adder 402b, which adds a constant value w to the binary value present at input terminal AIN. Comparator circuit 404 is implemented as a less-than comparator 404b, i.e., output signal O2 is high whenever the binary value present at input terminal B is less than the binary value present at input terminal A.

In the circuit of FIG. 4B, starting (for illustrative purposes) with equal values of AIN and BIN, a decrease in the value of BIN by a value of binary one is detected, causing the circuit to report that BIN is less than AIN (e.g., signal OUT goes high). However, the change in the value of signal OUT causes multiplexer circuit 403 to select a value of AIN to which the constant w has been added (AIN+w). Thus, a following increase in the value of BIN by a value of binary one is ignored, although BIN is no longer less than AIN. Not until BIN is greater than AIN by a value of w does the binary hysteresis comparator circuit of FIG. 4B detect the change and report that BIN is no longer less than AIN (e.g., signal OUT goes low). Thus, binary hysteresis is provided to multi-bit signal BIN. As previously noted, the circuit also provides hysteresis to signal AIN.

Note that the circuit of FIG. 4B can also be implemented using a less-than-or-equal-to comparator circuit, in which output signal O1 is high whenever the binary value present at input terminal B is less than or equal to, i.e., no more than, the binary value present at input terminal A. The resulting circuit is a less-than-or-equal-to comparator circuit providing binary hysteresis.

Figure 5:
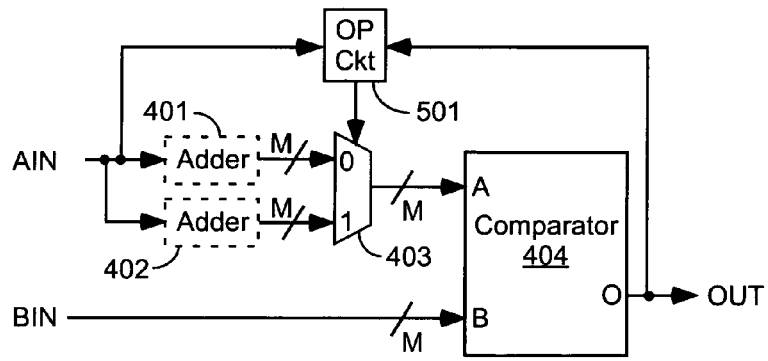
FIG. 5 illustrates a binary hysteresis comparator circuit having overflow protection.

FIG. 5 illustrates a variation on the binary hysteresis comparator circuit of FIG. 4, in which overflow protection is provided. The circuit of FIG. 5 is similar to the circuit of FIG. 4, except that an overflow prevention (OP) circuit 501 is inserted between the output terminal of comparator circuit 404 and the select terminal of multiplexer circuit 403. An additional input signal to overflow prevention circuit 501 is provided by signal AIN. In other embodiments (not shown), instead of signal AIN, one or two additional input terminals of overflow prevention circuit 501 are coupled to one or both of the data input terminals of multiplexer circuit 403.

The overflow prevention circuit prevents the multiplexer circuit from selecting an invalid value, if such a value is provided by one of the adder circuits. For example, if adder circuit 401 provides an all-zero value and values of less than zero are not supported, overflow prevention circuit 501 can ensure that the output of adder circuit 401 is selected rather than the negative value that can appear on the alternative input terminal of multiplexer circuit 403.

Figure 6:
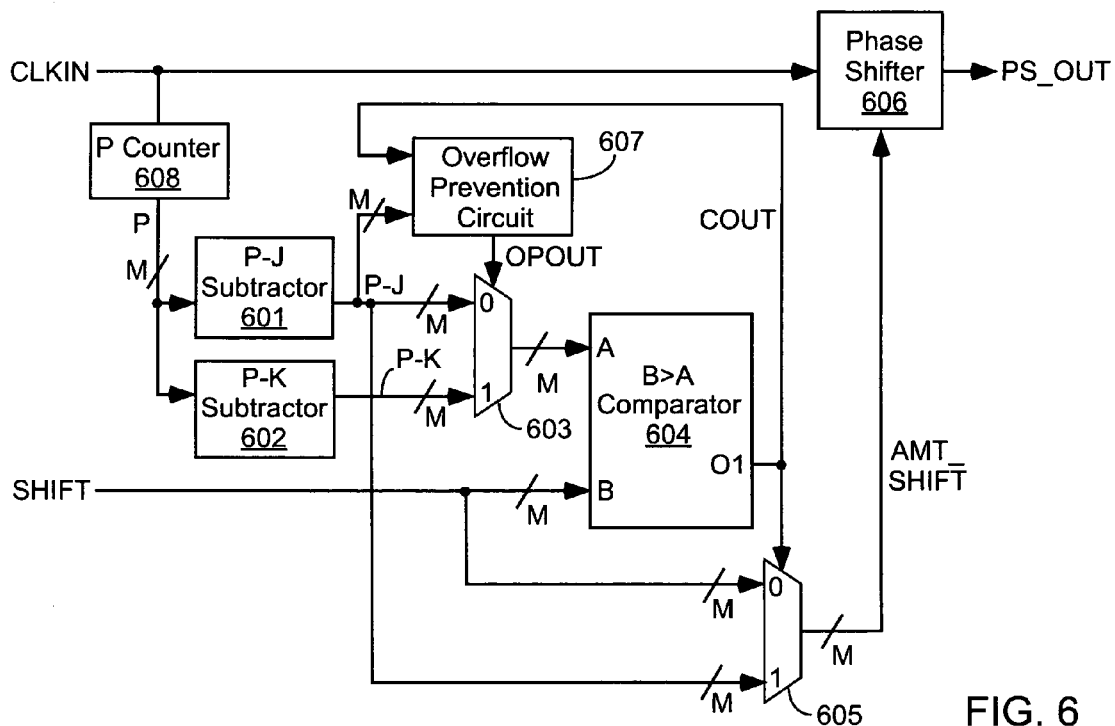
FIG. 6 illustrates a phase shifter circuit that utilizes the binary hysteresis comparator circuit of FIG. 5.

FIG. 6 illustrates an application in which the circuit of FIG. 5 can advantageously be utilized. The circuit of FIG. 6 is a phase shifter circuit in which the binary hysteresis comparator circuit of FIG. 5 is utilized to control the phase shifter.

The phase shifter circuit of FIG. 6 includes a period counter (P counter) circuit 608, two subtractors 601–602, multiplexer circuits 603 and 605, a B>A (B greater than A) comparator circuit 604, an overflow prevention circuit 607, and a phase shifter 606.

Period counter circuit 608 counts a number of counts P in one period of input clock signal CLKIN, as is later described in conjunction with FIG. 8. The number of counts P has M bits. P-J subtractor 601 subtracts a constant J from the number of counts P; while P-K subtractor 602 subtracts a constant K from the number of counts P. Each of signals P-J and P-K also has M bits. Subtractor 601 is included to prevent the phase shifter from shifting clock signal CLKIN by exactly one clock period. In the pictured embodiment, K is greater than J by an amount sufficient to compensate for variations caused by variations in temperature, power supply, or processing. The difference between K and J defines the amount of binary hysteresis provided by the circuit of FIG. 6, in a fashion similar to the constant w described in connection with FIG. 4A.

Multiplexer circuit 603 has a first data input terminal coupled to receive the output signal P-J from subtractor 601, a second data input terminal coupled to receive the output signal P-K from subtractor 602, a select terminal OPOUT coupled to the output terminal of overflow prevention circuit 607, and an output terminal that provides the multi-bit value A to comparator circuit 604.

The B value is provided to comparator circuit 604 by input terminal SHIFT. SHIFT is an M-bit signal that indicates the number of counts by which the phase shifter is supposed to shift the input clock signal. The SHIFT value can be provided, for example, by an external bus, a value stored in on-chip memory, other circuitry included in the same integrated circuit, and so forth. Therefore, the SHIFT signal can be subject to binary noise. The invention increases the accuracy of the phase shifter by rendering comparator circuit 604 less susceptible to binary noise on the SHIFT signal.

In other embodiments, the SHIFT signal is stable, but the CLKIN input signal is subject to noise, e.g., when signal CLKIN is provided by a pulse generator or other circuit subject to power high VCC and/or temperature fluctuation. The circuit of FIG. 6 provides binary hysteresis to both input signals, as the circuit evaluates the relationship between the two signals.

Multiplexer circuit 605 has a first data input terminal coupled to receive the SHIFT signal, a second data input terminal coupled to receive the output signal P-J from subtractor 601, a select terminal coupled to the comparator output signal COUT, and an output terminal that provides an M-bit signal AMT_SHIFT to comparator circuit 604. Signal AMT_SHIFT provides a corrected SHIFT signal to phase shifter 606, eliminating much of the noise that can be present on signal SHIFT.

Subtractor circuits 601–602 can be implemented in many different ways, including, for example, as well-known ripple adder adding a negative number. Multiplexer circuits 603 and 605 can also be implemented, for example, using any of the well-known multiplexer implementations. Phase shifter 606 is preferably implemented as a digital phase shifter circuit. For example, the present inventor has described several digital phase shifters suitable for use with the embodiment of FIG. 6 in co-pending, commonly-owned U.S. patent application Ser. No. 10/696,227, filed Oct. 28, 2003 and entitled, "Counter-Based Phase Shifter Circuits and Methods with Optional Duty Cycle Correction", which is hereby incorporated herein by reference.

Figure 7:
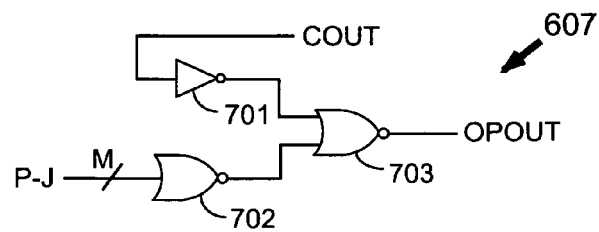
FIG. 7 illustrates an overflow prevention circuit that can be used, for example, in the phase shifter circuit of FIG. 6.

FIG. 7 illustrates one embodiment of overflow circuit 607 that can be used, for example, in the phase shifter circuit of FIG. 6. In this example, M is no greater than four, so all of the bits in signal P-J can be NORed together in NOR gate 702. Signal COUT from comparator circuit 604 (see FIG. 6) is provided to inverter 701. Inverter 701 and NOR gate 702 both drive NOR gate 703, which provides output signal OPOUT to the select terminal of multiplexer circuit 603.

The circuit of FIG. 7 operates as follows. When all bits of signal P-J are low, the output of NOR gate 702 is high, pulling signal OPOUT low through NOR gate 703. Thus, when all bits of signal P-J are low, signal P-J is automatically selected by multiplexer circuit 603. Since P-K is less than P-J, signal P-K is a negative value. However, because of the low value on signal OPOUT, the negative value on signal P-K is never selected. Hence, circuit 607 provides negative overflow protection.

In another embodiment (not shown), J is two and K is four. To prevent a negative value on signal P-K from being selected by multiplexer circuit 603, the overflow prevention circuit enables binary hysteresis only if P is greater than or equal to four. In other words, with a 4-bit value of P, hysteresis is disabled whenever P is equal to 00xx, where x is a don't-care value. Therefore, the two input signals to NOR gate 702 (see FIG. 7) are the two most significant bits of the value P. Clearly, in this example, the additional input signal to overflow prevention circuit 607 (see FIG. 7) is P, rather than P-J, as this alteration simplifies the logic in this example. As these examples illustrate, the overflow prevention circuit can be implemented in various ways, depending on the value being tested and the test being performed on that value.

Figure 8:
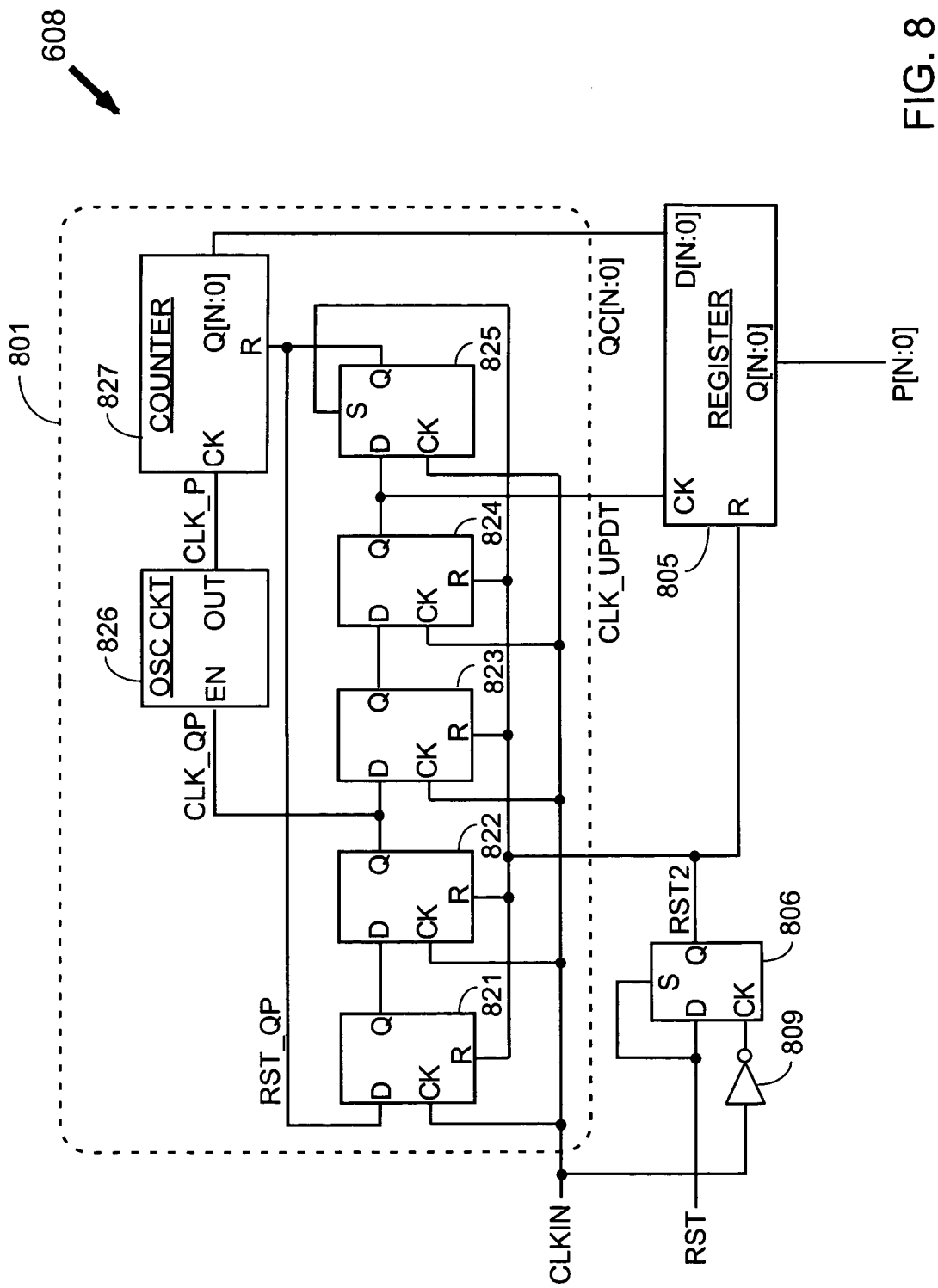
FIG. 8 illustrates a period counter circuit that can be used, for example, in the phase shifter circuit of FIG. 6.

FIG. 8 illustrates one embodiment of period counter circuit 608 that can be used, for example, in the phase shifter circuit of FIG. 6. The period counter circuit of FIG. 8 uses a relatively faster clock signal generated by an oscillator circuit 826 to count a number of counts P (P[N:0]) in one period of input clock signal CLKIN. (N is an integer. In the exemplary embodiment described herein, N is three, but N can have other values, as desired.) The number of counts P is stored in register 805, from which P is passed to subtractors 601–602 in FIG. 6.

Period counter circuit 608 includes counter circuit 801, a reset circuit including inverter 809 and a set flip-flop 806, and an M-bit register 805, where M=N+1.

In the pictured embodiment, counter circuit 801 is designed to recount the length of the input clock pulse (i.e., to generate a new value of P) every fifth clock cycle. In other embodiments, the periodicity of the count has other values, e.g., the desired periodicity can be selected based on the stability of the input clock frequency. In other embodiments, other implementations of period counter circuit 608 are used. Any appropriate embodiment can be used.

In the pictured embodiment, counter circuit 801 has as inputs input clock signal CLKIN and reset signal RST2 from the reset circuit. Counter circuit 801 provides a clock update signal CLK_UPDT and a counter output bus QC[N:0] representing the value P. Counter circuit 801 includes reset flip-flops 821–824, set flip-flop 825, oscillator circuit 826, and counter 827. Flip-flops 821–825 are coupled in series, and serve to provide three non-overlapping clock pulses in the following repeating sequence: RST_QP, CLK_QP, and CLK_UPDT. Each of these signals is high for only one clock cycle.

Initially, signal RST_QP is high, because flip-flop 825 is a set flip-flop, and counter 801 is reset. The first rising edge of signal CLKIN brings signal RST_QP low. On the second rising edge of signal CLKIN, signal CLK_QP provides a high value on oscillator enable signal EN to oscillator circuit

826. Thus, oscillator enable signal EN is high for one out of every five input clock cycles. Oscillator circuit 826 generates a relatively fast oscillator output signal OUT (i.e., faster than input clock signal CLKIN) whenever signal EN is high. The oscillator output signal CLK_P is used by counter 827 to measure the input clock period. Thus, in the pictured embodiment counter 827 performs the counting process only during one input clock period out of each five input clock periods. On the fourth rising edge of signal CLKIN, signal CLK_UPDT goes high. On the fifth rising edge of signal CLKIN, signal RST_QP goes high again, resetting counter 827. The cycle then repeats each five clock cycles.

Note that the number of flip-flops coupled in series in counter circuit 801 determines the frequency with which the length of the input clock period is determined. For example, in the embodiment of FIG. 8, the clock period is measured every five clock cycles. By adding another reset flip-flop to the chain (e.g., in front of set flip-flop 825), the period would be measured every six clock cycles, and so forth. It will be clear to one of skill in the relevant arts that this selection is a matter of design choice.

Any appropriate oscillator circuit can be used to implement oscillator circuit 826 of FIG. 8. For example, the well known ring oscillator design (e.g., a loop including an odd number of logic gates, e.g., two inverters and a NAND gate driven by an enable signal) can be used. This embodiment is particularly useful when the phase shifter circuit is implemented in a programmable logic device (PLD), because the oscillator can be implemented using the programmable logic blocks of the PLD. In some embodiments, external oscillators are used.

Any appropriate counter can be used to implement counter 827 of FIG. 8. For example, a well known ripple counter can be used. In some embodiments, double-edge flip-flops are used to double the count stored in the counter.

In the pictured embodiment, the reset circuit includes a flip-flop 806 having a data input terminal and a set terminal both driven by a reset signal RST, a clock input terminal driven by signal CLKIN through inverter 809, and an output terminal providing reset signal RST2 to counter circuit 801 and register 805.

Figure 9:
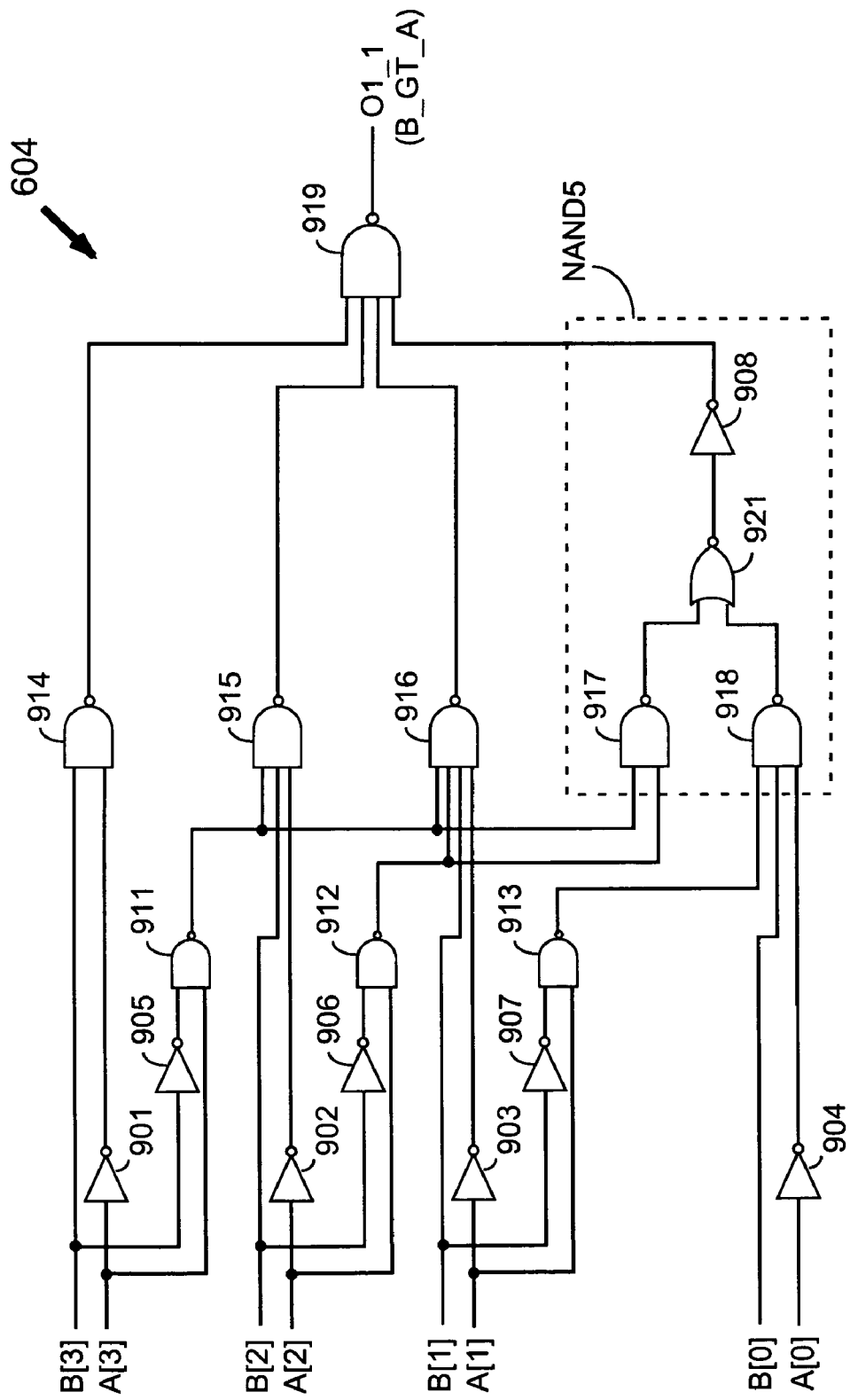
FIG. 9 illustrates a "greater-than" comparator circuit that can be used, for example, in the phase shifter circuit of FIG. 6.

FIG. 9 illustrates a "greater-than" comparator circuit 604 that can be used, for example, in the phase shifter circuit of FIG. 6. For illustrative purposes, multi-bit signals A and B are each assumed to have four bits. The circuit of FIG. 9 includes inverters 901–908, NAND gates 911–919, and NOR gate 921. Note that any appropriate greater-than comparator circuit can be used to implement circuit 604 in FIG. 6; the implementation shown in FIG. 9 is merely exemplary.

NAND gate 914 is driven by signal B[3], the most significant bit of signal B, and by signal A[3], the most significant bit of signal A, inverted by inverter 901. NAND gate 914 drives NAND gate 919, which provides the comparator output signal O1_1. Signal O1_1 (also called B_GT_A) is high whenever the binary value of signal B is greater than the binary value of signal A.

NAND gate 911 is driven by signal A[3] and by signal B[3] inverted by inverter 905. NAND gate 915 is driven by NAND gate 911, signal B[2], and signal A[2] inverted by inverter 902. NAND gate 915 also drives NAND gate 919.

NAND gate 912 is driven by signal A[2] and by signal B[2] inverted by inverter 906. NAND gate 916 is driven by NAND gate 911, NAND gate 912, signal B[1], and signal A[1] inverted by inverter 903. NAND gate 916 also drives NAND gate 919.

NAND gate 913 is driven by signal A[1] and by signal B[1] inverted by inverter 907. NAND gate 917 is driven by NAND gate 911 and NAND gate 912. NAND gate 918 is driven by NAND gate 913, signal B[0], and signal A[0] inverted by inverter 904. NOR gate 921 is driven by NAND gates 917 and 918, and drives inverter 908, which also drives NAND gate 919. Note that inverter 908, NOR gate 921, and NAND gates 917 and 918 together implement a 5-input NAND gate NAND5.

Note that the circuit of FIG. 9, a greater-than comparator (providing a high signal when B is greater than A), can be changed to a less-than comparator (providing a high signal when B is less than A) simply by interchanging the A and B input signals. The circuit of FIG. 9 can be changed to a less-than-or-equal-to comparator (providing a high signal when B is less than or equal to A) simply by inverting the output signal. A greater-than-or-equal-to comparator (providing a high signal when B is greater than or equal to A) can be implemented by interchanging the A and B input signals in the circuit of FIG. 9 and inverting the output signal. Each of these circuits can be used, for example, in the embodiment of FIG. 4B. Many other comparator implementations are also fully compatible with the present invention and can be used in the binary hysteresis circuits and methods described herein.

The figures shown and described herein illustrate a variety of different comparator circuits providing binary hysteresis. It will be apparent to one skilled in the art after perusing the present specification and drawings that the present invention can be practiced within these and other architectural variations.

Figure 10:
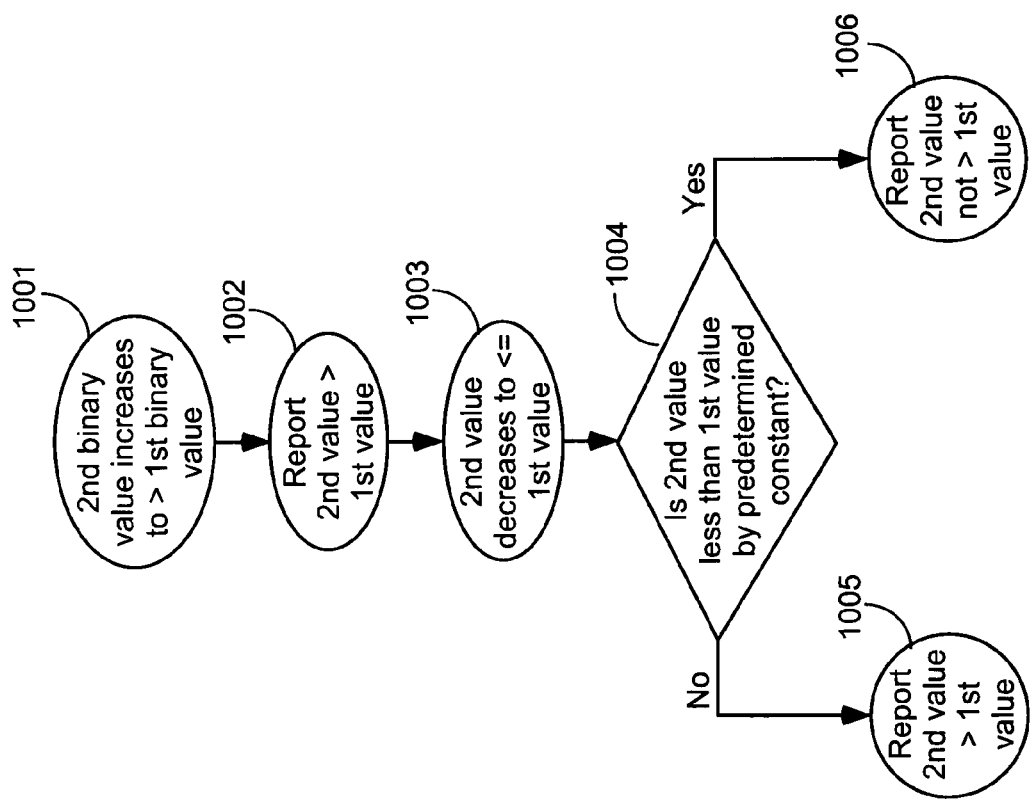
FIG. 10 illustrates the steps of an exemplary method of performing a greater-than comparison between two binary input values while providing binary hysteresis.

FIG. 10 illustrates the steps of an exemplary method of performing a greater-than comparison between first and second binary input values while providing binary hysteresis. These steps can be performed, for example, using the exemplary circuit illustrated in FIG. 4A. However, other circuits can also be used.

In step 1001, the second binary value (e.g., BIN) increases to the point where the second value is greater than the first value (e.g., AIN). In step 1002, in response to this increase in the second value, the circuit reports that the second value is greater than the first value (e.g., a "greater-than" output signal OUT goes high). In step 1003, the second value decreases to a value less than or equal to (i.e., not greater than) the first value.

At this point in the process, one of two things will occur. If the second value is not less than the first value by a predetermined constant (e.g., w) in step 1004, then the circuit continues to report that the second value is greater than the first value in step 1005 (e.g., signal OUT stays high). However, if the second value is less than the first value by a predetermined constant (e.g., w) in step 1004, then the circuit reports that the second value is no longer greater than the first value in step 1006 (e.g., signal OUT goes low).

Figure 11:
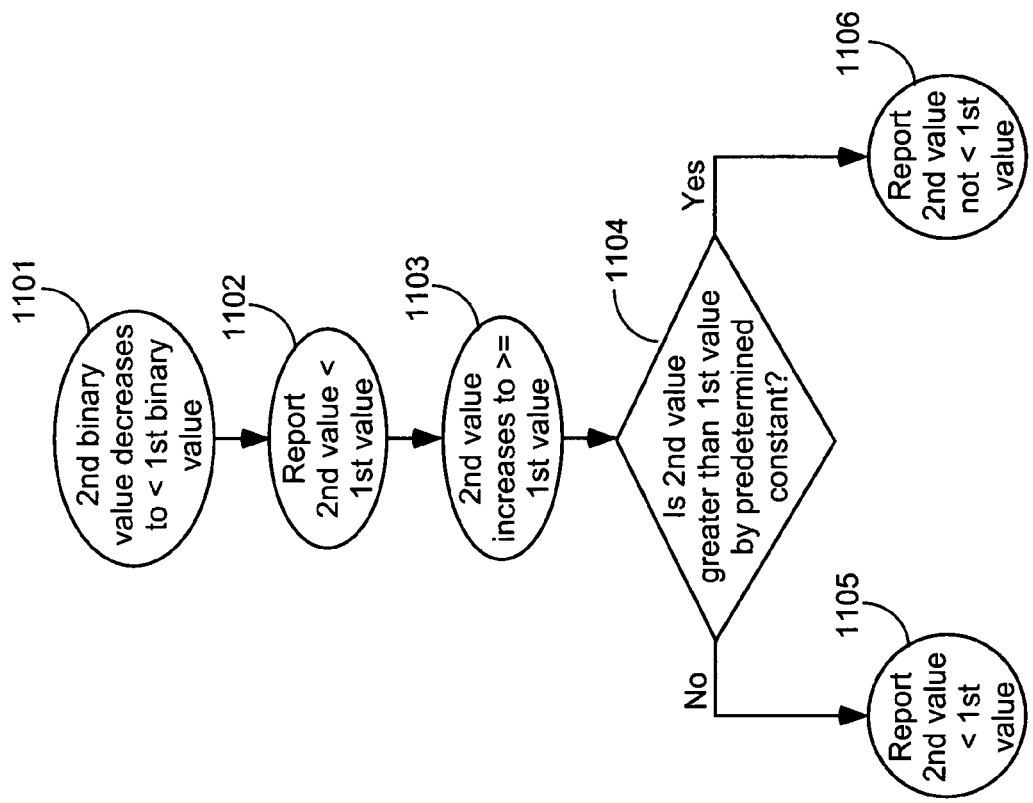
FIG. 11 illustrates the steps of an exemplary method of performing a less-than comparison between two binary input values while providing binary hysteresis.

FIG. 11 illustrates the steps of an exemplary method of performing a less-than comparison between first and second binary input values while providing binary hysteresis. These steps can be performed, for example, using the exemplary circuit illustrated in FIG. 4B. However, other circuits can also be used.

In step 1101, the second binary value (e.g., BIN) decreases to the point where the second value is less than the first value (e.g., AIN). In step 1102, in response to this decrease in the second value, the circuit reports that the second value is less than the first value (e.g., a "less-than" output signal OUT goes high). In step 1103, the second value increases to a value greater than or equal to (i.e., not less than) the first value.

At this point in the process, one of two things will occur. If the second value is not greater than the first value by a predetermined constant (e.g., w) in step 1104, then the circuit continues to report that the second value is less than the first value in step 1105 (e.g., signal OUT stays high). However, if the second value is greater than the first value by a predetermined constant (e.g., w) in step 1104, then the circuit reports that the second value is no longer less than the first value in step 1106 (e.g., signal OUT goes low).

Figure 12:
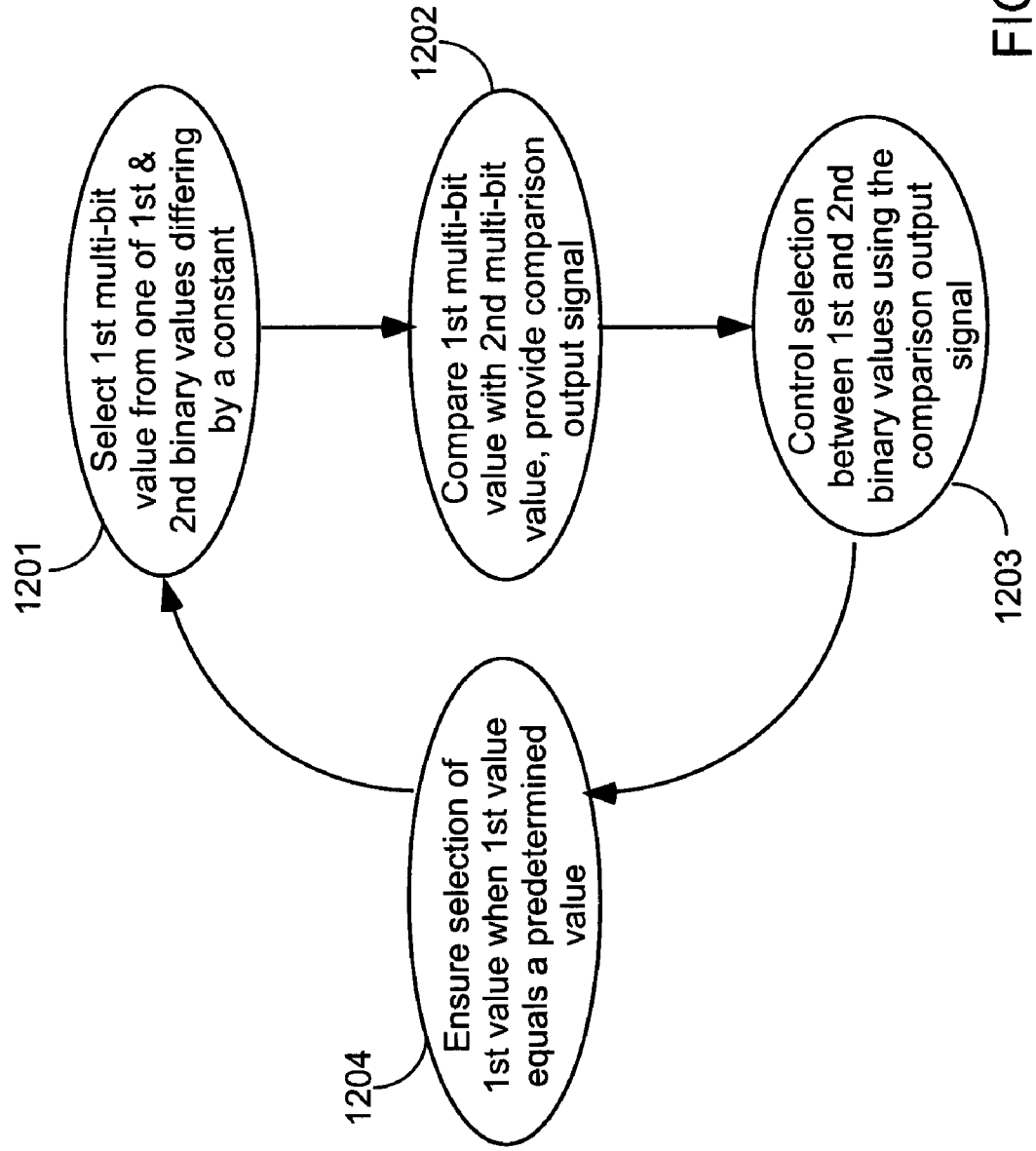
FIG. 12 illustrates the steps of an exemplary method of comparing two binary values while providing binary hysteresis.

FIG. 12 illustrates the steps of an exemplary method of comparing two binary values while providing binary hysteresis. In step 1201, a first multi-bit value is selected from one of first and second binary values. The first and second binary values differ by a predetermined constant. For example, the first and second binary values can be multi-bit signals AIN and AIN+/−w (see FIGS. 4A and 4B), or P-J and P-K (see FIG. 6). The selected first multi-bit value can be the signal A. The selection between the two binary values can be made, for example, using multiplexer circuit 403 or 603.

In step 1202, the selected (first) multi-bit value is compared with a second multi-bit value, and a comparison output signal is provided that represents the results of the comparison. This step can be performed, for example, by any of comparator circuits 404, 404a, 404b, and 604. The second multi-bit value can be, for example, either signal BIN or signal B. Performing the comparison can comprise determining whether the second multi-bit value is greater than the first multi-bit value, no less than (i.e., greater than or equal to) the first multi-bit value, less than the first multi-bit value, or no greater than (i.e., less than or equal to) the first multi-bit value.

In step 1203, the comparison output signal from step 1202 is used to control the selection between the first and second binary values in step 1201 (e.g., by controlling the multiplexer circuit making the selection). In optional step 1204, the selection of the first value can be ensured whenever the first value equals a predetermined value (e.g., all zeros). This optional step can be performed, for example, using the overflow prevention circuits described herein.

Those having skill in the relevant arts of the invention will now perceive various modifications and additions that can be made as a result of the disclosure herein. For example, the above text describes the circuits of the invention in the context of programmable logic devices (PLDs). However, the circuits of the invention can also be implemented in other integrated circuits, including non-programmable circuits. The circuits of the invention can also be implemented in other electronic systems, for example, in printed circuit boards including discrete devices.

Further, comparator circuits, comparators, multiplexer circuits, adder circuits, adders, subtractors, counter circuits, period counter circuits, overflow prevention circuits, phase shifter circuits, phase shifters, oscillator circuits, reset circuits, registers, flip-flops, inverters, NAND- and NOR-gates, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A phase shifter circuit, comprising:
   a circuit clock input terminal;
   a multi-bit circuit input terminal;
   a counter circuit having an input terminal coupled to the circuit clock input terminal and further having a multi-bit output terminal;
   a first subtractor having a multi-bit input terminal coupled to the output terminal of the counter circuit and further having a multi-bit output terminal;
   a first multiplexer circuit having a first multi-bit data input terminal coupled to the output terminal of the counter circuit, a second multi-bit data input terminal coupled to the output terminal of the first subtractor, a select terminal, and a multi-bit output terminal;
   a comparator circuit having a first multi-bit input terminal coupled to the output terminal of the first multiplexer circuit, a second multi-bit input terminal coupled to the circuit input terminal, and an output terminal coupled to the select terminal of the first multiplexer circuit;
   a second multiplexer circuit having a first multi-bit data input terminal coupled to the circuit input terminal, a second multi-bit data input terminal coupled to the output terminal of the counter circuit, a select terminal coupled to the output terminal of the comparator circuit, and an output terminal; and
   a phase shifter having a clock input terminal coupled to the circuit clock input terminal, a multi-bit control terminal coupled to the output terminal of the second multiplexer circuit, and an output terminal.

2. The phase shifter circuit of claim 1, further comprising a second subtractor coupled between the output terminal of the counter circuit and the first data input terminal of the first multiplexer circuit, and between the output terminal of the counter circuit and the second data input terminal of the second multiplexer circuit, wherein the second subtractor subtracts a smaller number than the first subtractor.

3. The phase shifter circuit of claim 1, further comprising an overflow prevention circuit coupled between the output terminal of the comparator circuit and the select terminal of the first multiplexer circuit, the overflow prevention circuit having an additional input terminal coupled to the output terminal of the counter circuit.

4. The phase shifter circuit of claim 1, wherein the comparator circuit is coupled to provide an indicator at the output terminal of the comparator circuit when a value at the second input terminal of the comparator circuit is greater than a value at the first input terminal of the comparator circuit.

5. The phase shifter circuit of claim 1, wherein the comparator circuit is coupled to provide an indicator at the output terminal of the comparator circuit when a value at the second input terminal of the comparator circuit is not less than a value at the first input terminal of the comparator circuit.

* * * * *